United States Patent [19]
Choi et al.

[11] Patent Number: 5,591,550
[45] Date of Patent: Jan. 7, 1997

[54] PHASE SHIFT MASK AND METHOD FOR FORMING PHASE SHIFT MASK

[75] Inventors: Yong K. Choi, Seoul; Young J. Song, Chungcheongbuk-do, both of Rep. of Korea

[73] Assignee: LG Semicon Co., Ltd., Cheongju, Rep. of Korea

[21] Appl. No.: 423,113

[22] Filed: Apr. 17, 1995

[51] Int. Cl.$^6$ .................................................. G03F 9/00
[52] U.S. Cl. .............................. 430/5; 430/314; 430/322; 430/323
[58] Field of Search ............................... 430/5, 314, 322, 430/323, 324

[56] References Cited

U.S. PATENT DOCUMENTS

5,409,789  4/1995  Ito .................................................. 430/5

*Primary Examiner*—S. Rosasco
*Attorney, Agent, or Firm*—Alan R. Loudermilk

[57] ABSTRACT

A halftone phase shift mask and a method for forming a halftone phase shift mask. The method includes: forming a halftone pattern material layer on a substrate; defining positions for forming more than one open region of a desired pattern and defining positions for forming one or more dummy open regions that can offset respective new side lobes having a high intensity formed by overlap of side lobes of light irradiated onto the substrate as well as the halftone material layer; and forming the patterned open regions and dummy open regions that can offset respective new side lobes at the defined positions on the halftone pattern material layer by subjecting the halftone pattern material layer to patterning.

9 Claims, 8 Drawing Sheets

PHASE SHIFT MASK AND METHOD FOR FORMING PHASE SHIFT MASK

FIELD OF THE INVENTION

This invention relates to methods for forming phase shift masks, more particularly to methods for forming halftone phase shift masks.

BACKGROUND OF THE INVENTION

The halftone phase shift mask generally is considered an improvement of the chrome phase shift mask. The halftone phase shift mask is called an attenuated phase shift mask, or a "tπ" phase shift mask (t means transmittance).

The structure and principles of the phase shift mask will be explained hereinafter, referring to FIGS. 1A to 1D.

Figure 1A:
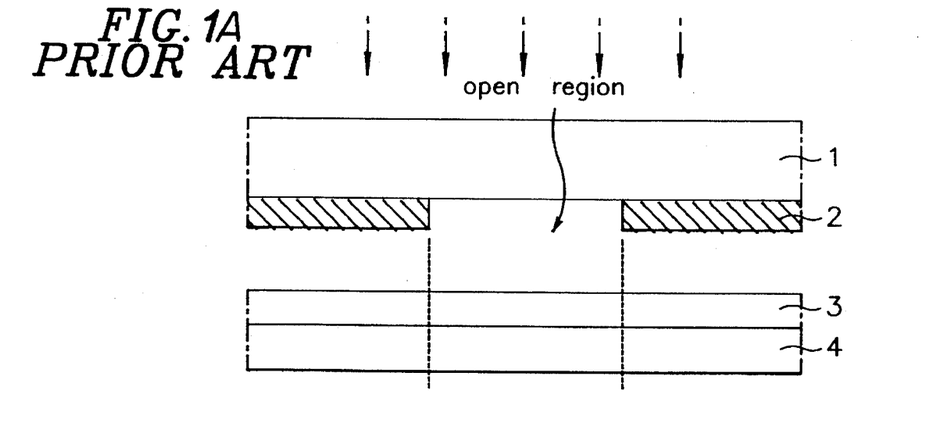
FIGS. 1A to 1D illustrate the structure and principles of a conventional halftone phase shift mask.

First, as illustrated in FIG. 1A, a halftone phase shift mask is formed by depositing halftone pattern material layer 2 of, such as, chrome oxide CrO, on transparent substrate 1 of, such as, quartz or glass. Halftone pattern material layer 2 has properties such as to shift the phase 180° and transmit only 4 to 30% of the light incident thereto.

Figure 1B:
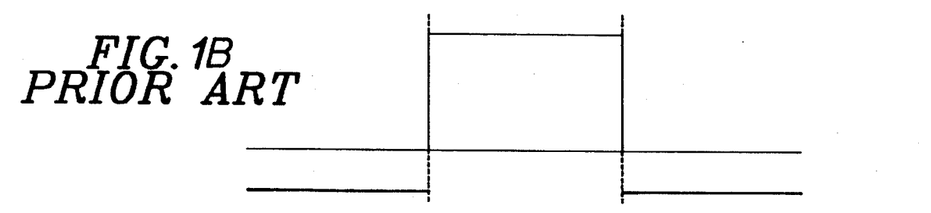

When the halftone shift mask positioned over wafer 4 having masking material 3 such as photoresist coated on the surface thereof is irradiated with light from above, the surface of masking material 3 exhibits an intensity profile of light as illustrated in FIG. 1B. That is, an open region without halftone pattern 2 thereon transmits light through transparent substrate 1 to exhibit a positive intensity profile of the light on masking material 3. On the other hand, the portion having halftone pattern 2 deposited thereon transmits 4 to 30% of the light with the phase shifted 180° to exhibit a negative value.

Figure 1C:
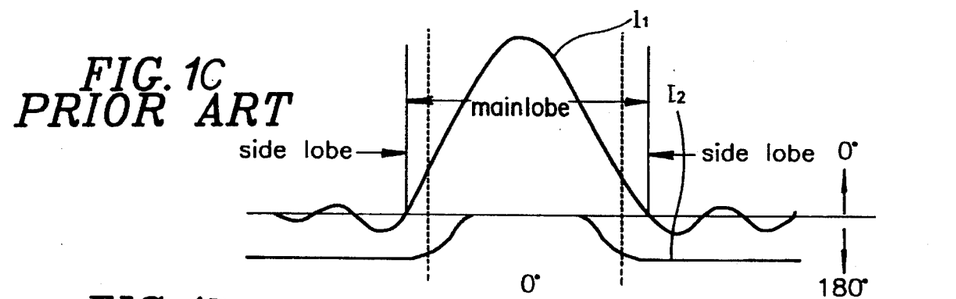

As illustrated in FIG. 1B, the intensity of light on masking material 3 has a rectangular profile. As illustrated in FIG. 1C, however, the intensity of light on wafer 4 has not a rectangular profile, but a sinusoidal profile. That is, beside the "overshoot" of the main lobe, side lobes are present, which repeat a pattern of "overshoot" and "undershoot."

In FIG. 1C, $I_1$ indicates an intensity profile of light formed by light passed through the open region with no halftone pattern material 2 deposited thereon, and $I_2$ indicates an intensity profile of light formed by the light passing through halftone pattern 2.

Figure 1D:
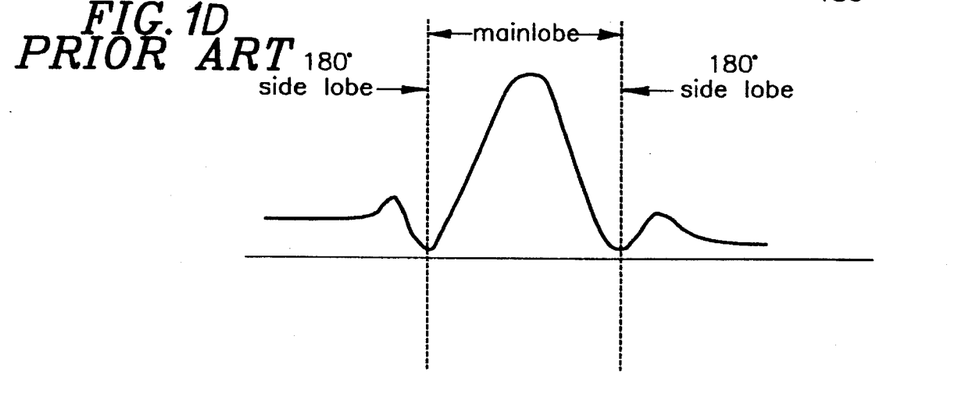

Illustrated in FIG. 1D is a final intensity profile of light which is a composite of the intensity profiles of $I_1$ and $I_2$. According to FIG. 1D, the intensity of light in the side lobes are weak compared to the intensity of light at the main lobe that the side lobe intensity can be considered negligible.

Since a conventional, common chrome phase shift mask only has the chrome pattern layer without halftone pattern material layer 2, the intensity of light on wafer 4 also is the same as $I_1$ of FIG. 1C. The intensity profiles of light of FIGS. 1C and 1D illustrate a case in which the light has been focused more accurately. In most cases, however, there remains a high probability of the light being defocused.

An advantage of the halftone phase shift mask over the conventional chrome phase shift mask is that the halftone phase shift mask is less likely to be defocused. The reason for this advantage is to be explained hereinafter.

Figures 2A, 2B:
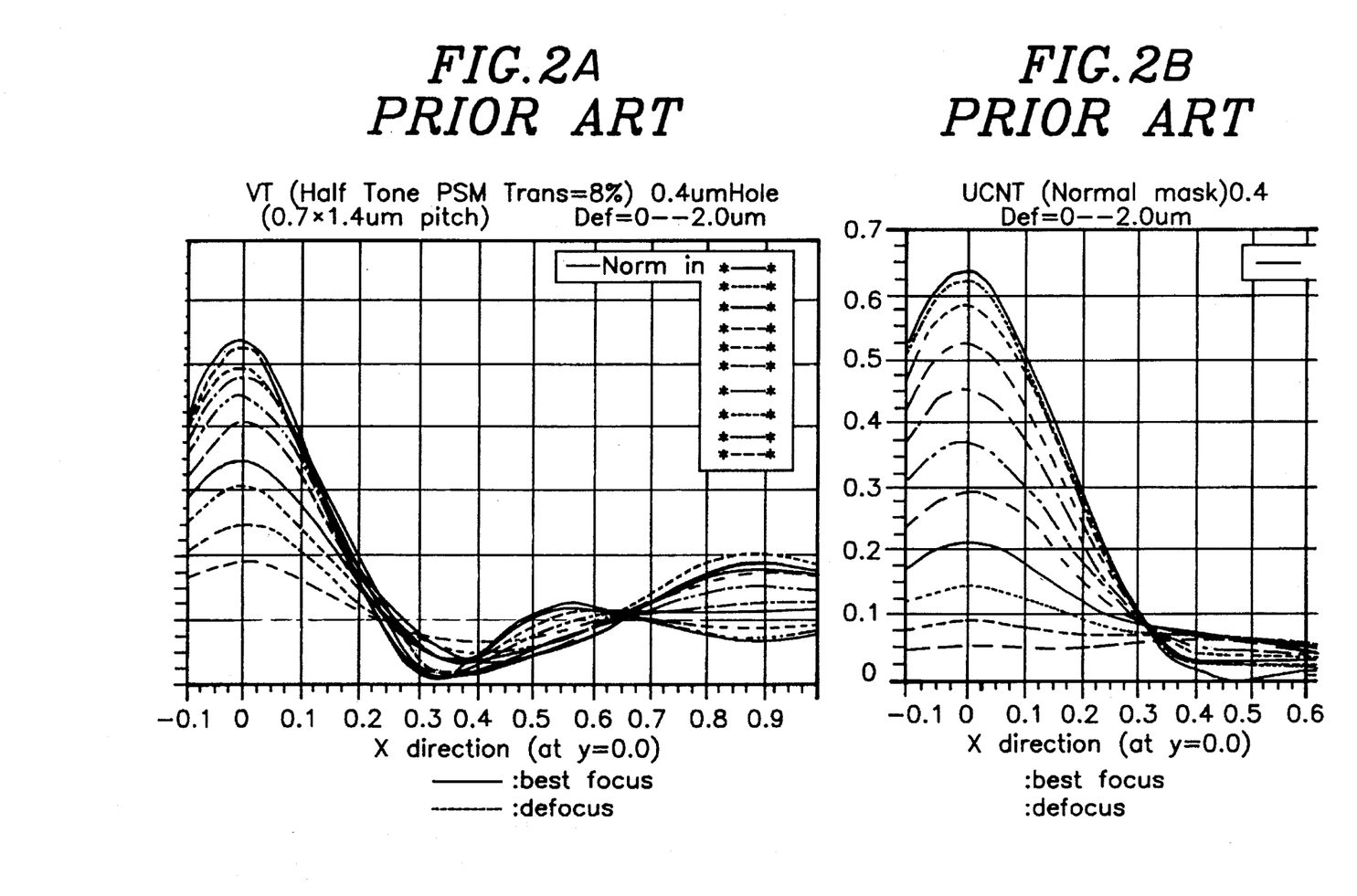
FIG. 2A is a graph illustrating the intensity of light passed through the conventional halftone phase shift mask depending on focusing conditions.
FIG. 2B is a graph illustrating the intensity of light passed through a conventional chrome phase shift mask depending on focusing conditions.

FIG. 2A is a graph illustrating intensity profiles of light for cases of being best focused and defocused using a halftone phase shift mask. FIG. 2B is a graph illustrating intensity profiles of light for cases of being best focused and defocused using a conventional chrome phase shift mask.

According to FIG. 2A, it can be seen that each of the main lobes has a higher intensity of light than respective side lobes, irrespective of the degree it has been defocused. According to FIG. 2B, however, it can be seen that the side lobes have a higher intensity of light than respective main lobes in the case of being seriously defocused. In such cases, patterns entirely different from what has been intended can form on masking material 3 of FIG. 1A.

As has been explained, the conventional halftone phase shift mask has an advantage in that it cannot only eliminate the side lobes that form unwanted patterns, but also carry out a more accurate patterning compared to other conventional phase shift masks even under a condition of being defocused, by composing the intensity of light on the open region with the intensity of light on halftone pattern material layer 2 having a phase of 180° and 3 to 40% transmissivity.

Figures 3A, 3B:
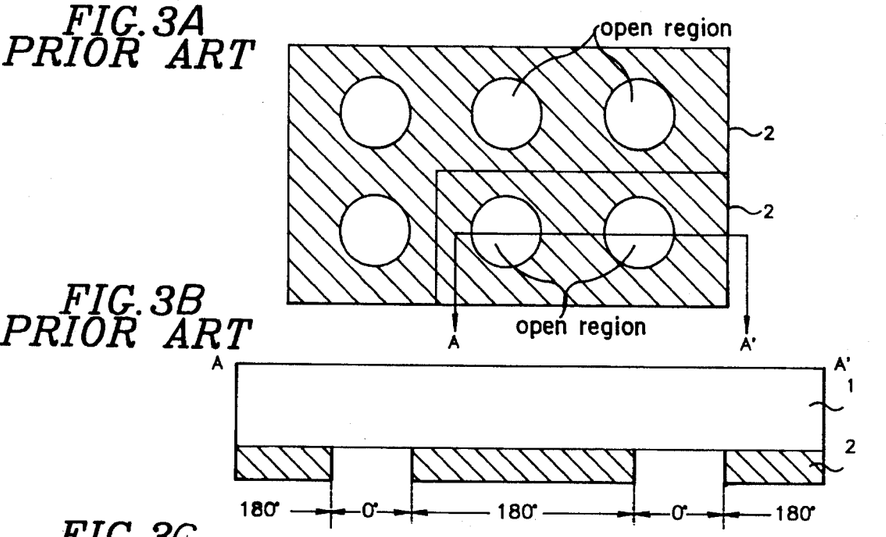
FIGS. 3A–3F illustrate disadvantages of the conventional halftone phase shift mask.
Figure 3C:
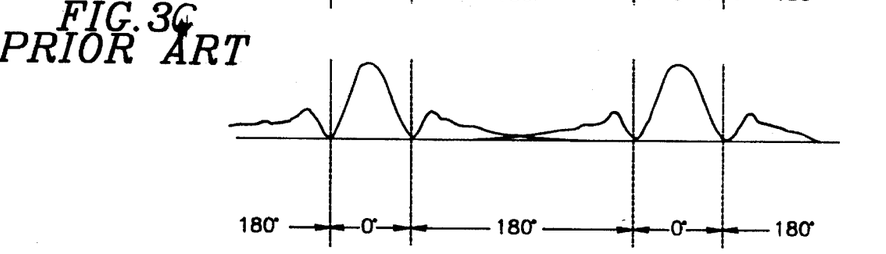

FIGS. 1A–1D and FIGS. 2A and 2B, however, illustrate cases when formation of only one pattern is taken into account, but not cases when formation of many patterns is taken into account. FIG. 3A is a plan view of a halftone phase shift mask with six open regions therein for forming six patterns on wafer 4 of FIG. 1A. FIG. 3B is a section across line 3B—3B of FIG. 3A, and FIG. 3C illustrates overlap between side lobes of the light passed through halftone pattern material layer 2 having two open regions therein.

Figure 3D:
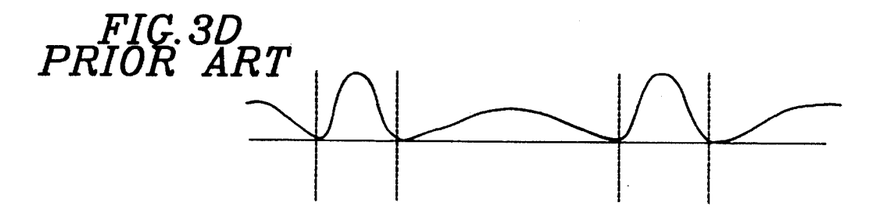
Figure 3E:
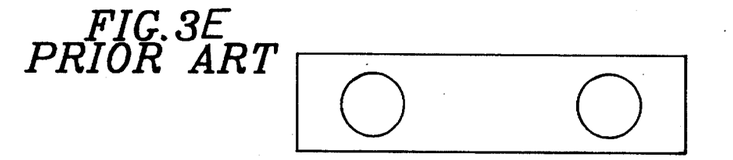
Figure 3F:
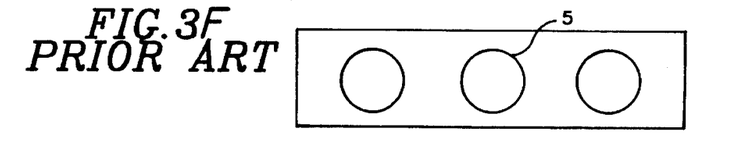

As illustrated in FIG. 3B, of the intensity profiles of the light passed through each of the open regions of the halftone phase shift mask, the intensity profiles of the light of the side lobes can overlap. When the overlap is extensive, new side lobes having almost the same intensity of light with each of the desired main lobes can be formed as illustrated in FIG. 3D. As a result, even though patterns illustrated in FIG. 3E were desired to have been formed on masking material 3, unwanted anomalous patterns 5 as illustrated in FIG. 3F can be formed on masking material 3. Accordingly, unwanted final patterns can be formed on wafer 4.

As has been explained, unwanted anomalous patterns 5 on masking material 3 can, or cannot, be formed depending on distances between the open regions of the halftone phase shift mask. That is, if the open regions are spaced apart with sufficient distances, overlap between the side lobes will not occur. With the recent trend of large scale integration of all semiconductor elements, however, as many patterns as possible should be arranged within a given area. Accordingly, as spaces between patterns become narrower, greater overlap between side lobes may occur as illustrated in FIGS. 3A to 3F, which further causes formation of unwanted anomalous patterns 5.

Figure 4:
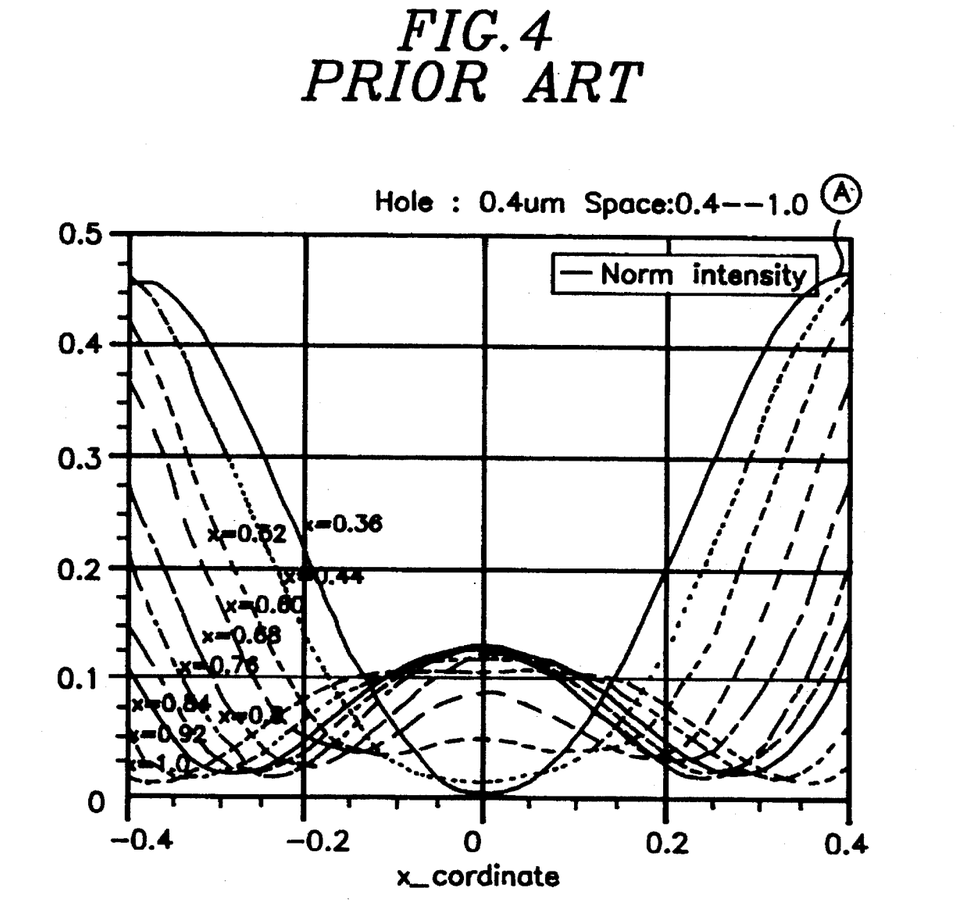
FIG. 4 illustrates overlap of two adjacent side lobes depending on distances between two adjacent open regions.

FIG. 4 illustrates the degree of overlap of the side lobes formed depending on the variation of a distance X between two adjacent open regions in a halftone phase shift mask. According to FIG. 4 it can be seen that, when distance x between the open regions is varied from 0.36 μm to 1.0 μm, the degree overlap of the two adjacent side lobes becomes greatest when distance X is 0.84 μm.

As has been explained, the conventional halftone phase shift mask has a problem in that it can cause undesired anomalous patterns on the masking material as well as on the wafer because overlap of the side lobes of light passed through halftone pattern material layer 2 form new side lobes having a high intensity of light.

SUMMARY OF THE INVENTION

The object of this invention devised for solving the foregoing problem is to provide a method for forming a halftone phase shift mask, which can eliminate new side lobes having a high intensity of light caused by overlap of adjacent side lobes, and, further, can prevent formation of unwanted anomalous patterns.

These and other objects and features of this invention can be achieved by providing a method for forming a halftone phase shift mask, including the steps of: forming a halftone pattern material layer on a substrate; defining positions for forming more than one open region of a desired pattern and for defining positions for forming at least more than one dummy open region that can offset respective new side lobes having a high intensity formed by overlap of side lobes of light upon irradiation of light onto the substrate as well as the halftone material layer; and forming the desired pattern of open regions and dummy open region(s) that can offset respective new side lobes at the defined positions on the halftone pattern material layer by subjecting the halftone pattern material layer to patterning.

DETAILED DESCRIPTION OF THE PREFERRED EMBODIMENTS

As has been explained, this invention provides dummy open regions for preventing formation of anomalous patterns due to overlap of adjacent side lobes.

Figure 5A:
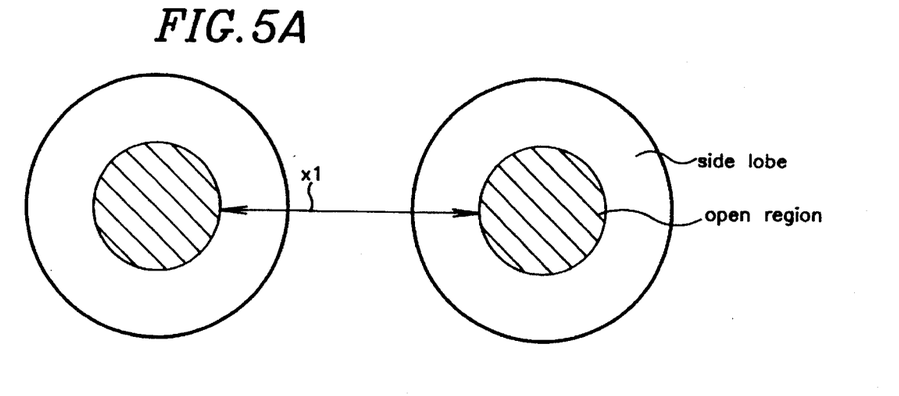
FIGS. 5A–5C illustrate a method for determining a position to form dummy open regions in a halftone phase shift mask having two open regions in accordance with this invention.
Figure 5B:
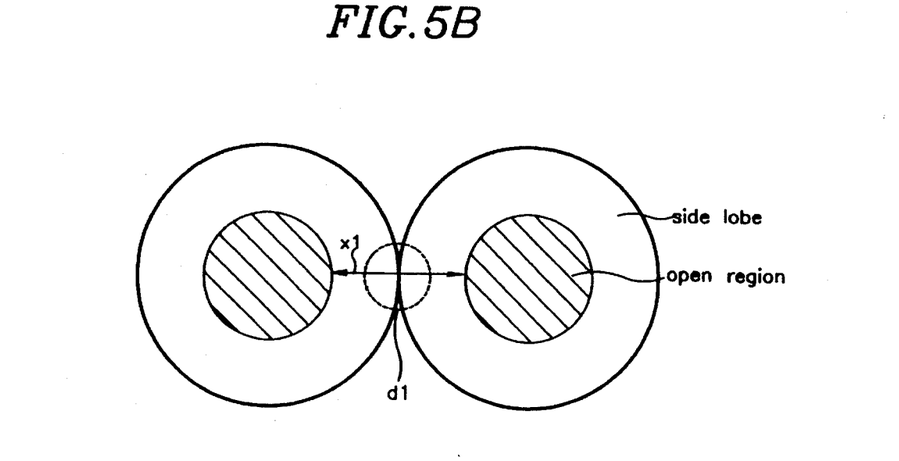
Figure 5C:
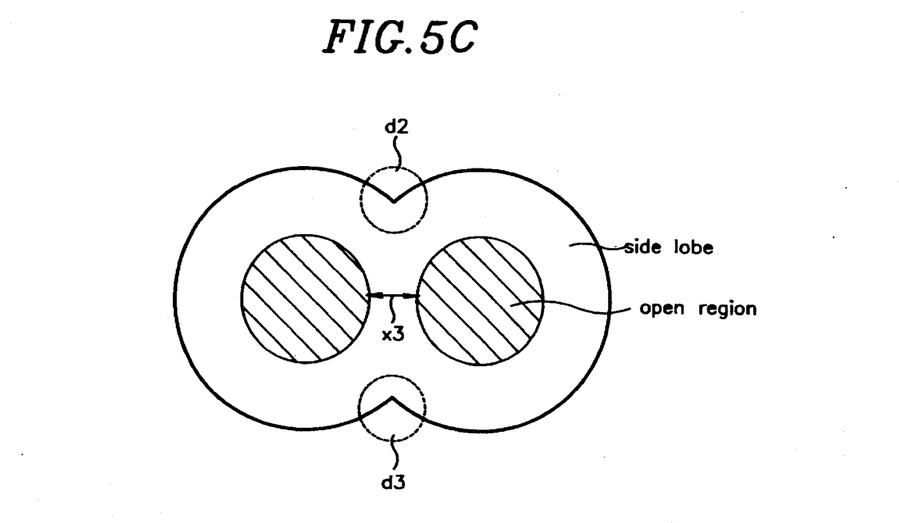

FIGS. 5A–5C illustrate a method for determining positions to form dummy open regions in a halftone phase shift mask having two open regions formed therein in accordance with this invention.

As illustrated in FIG. 5A, in case distance X1 between two open regions is enough to prevent overlap of side lobes, formation of the dummy open regions are not required. As illustrated in FIG. 5B, if distance X2 between the two open regions causes two side lobes overlap at one portion, position of formation of the dummy open region is determined as portion D1. As illustrated in FIG. 5C, if distance X3 between the two open regions makes two side lobes overlap at two portions, positions of formation of two dummy open regions are determined as two portions D2 and D3.

The dummy open regions are provided to offset new side lobes having a high intensity of light formed by overlap of side lobes. The principle of offset will be explained, referring to FIGS. 6A–6D, taking the case of FIG. 5B as an example.

Figure 6A:
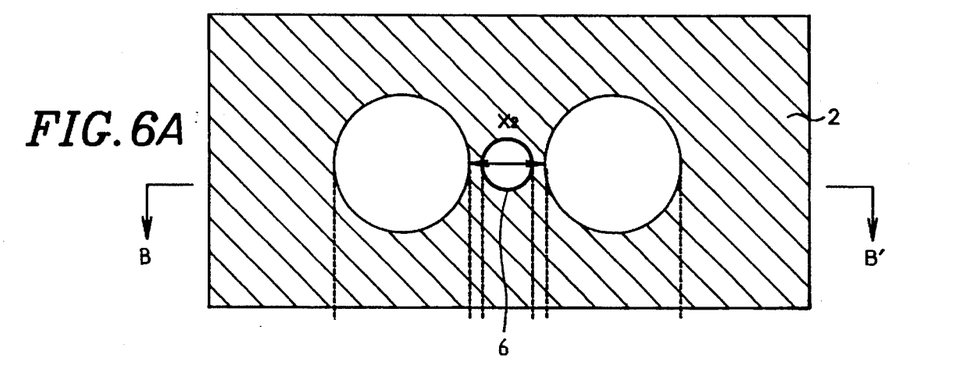
FIGS. 6A to 6D explain the structure and principles of a halftone phase shift mask in accordance with one embodiment of this invention.

First, as illustrated in FIG. 6A, two open regions of desired patterns are defined on halftone pattern material layer 2. Herein, halftone pattern material layer 2 may be formed of chrome oxide.

After finding a portion of the halftone pattern material layer corresponding to point D1, where two adjacent side lobes meet using the methodology of FIG. 5B, a position for forming dummy open region 6 that can eliminate the effect of overlap of the two side lobes is defined as illustrated. The defined positions on the halftone pattern material layer are subjected to a photo process and an etching process to form two open regions and one dummy open region at the same time.

Figure 6B:
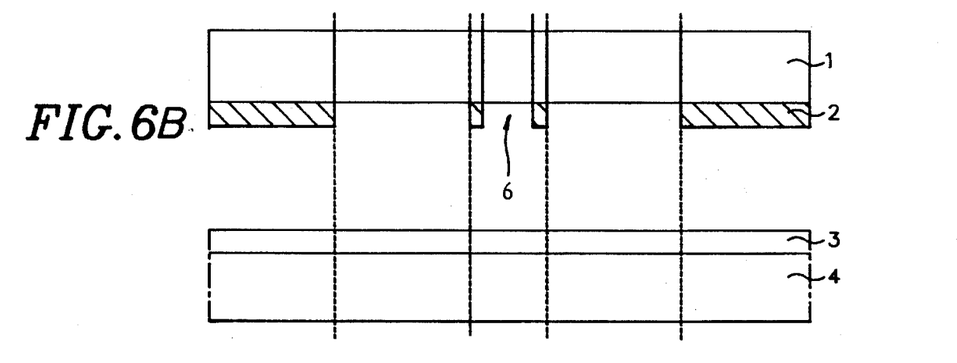

Illustrated in FIG. 6B is a section across line 6B—6B of FIG. 6A, wherein it can be seen that one dummy open region 6 has been provided between the two open regions.

In order to find the position of the portion corresponding to point D1 on the halftone pattern material layer where dummy open region 6 is to be formed, as has been explained with regard to FIGS. 5A–5C, after obtaining intensity profiles of light passing through halftone pattern material layer 2, point D1 on which side lobes of different profiles overlap extensively is found, such as by computer simulation.

Figure 6C:
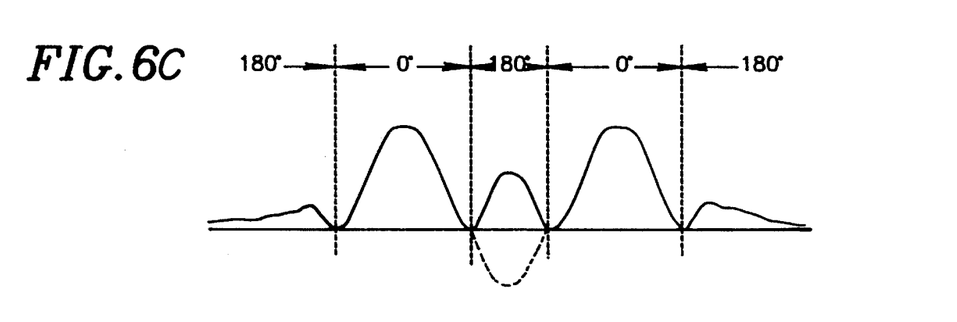

As a result, as illustrated in FIG. 6C, since a new side lobe having a high intensity of light formed by overlap of two side lobes is eliminated or offset by the intensity of light (dotted part) passed through dummy open region 6, the new side lobe does not affect an exposure process on the masking material and pattern formation on wafer 4.

Figure 6D:
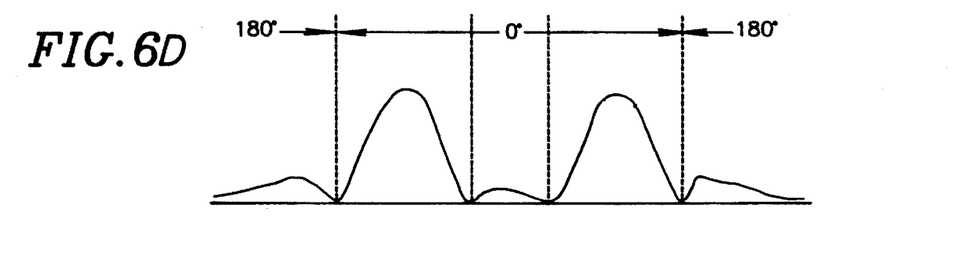

FIG. 6D is an intensity profile of light illustrating that the new side lobe having a high intensity of light has been eliminated.

Even though the foregoing embodiment has been based on a halftone phase shift mask having two open regions, it is evident that such a method can be applied to a halftone phase shift mask having more than two open regions.

Figure 7A:
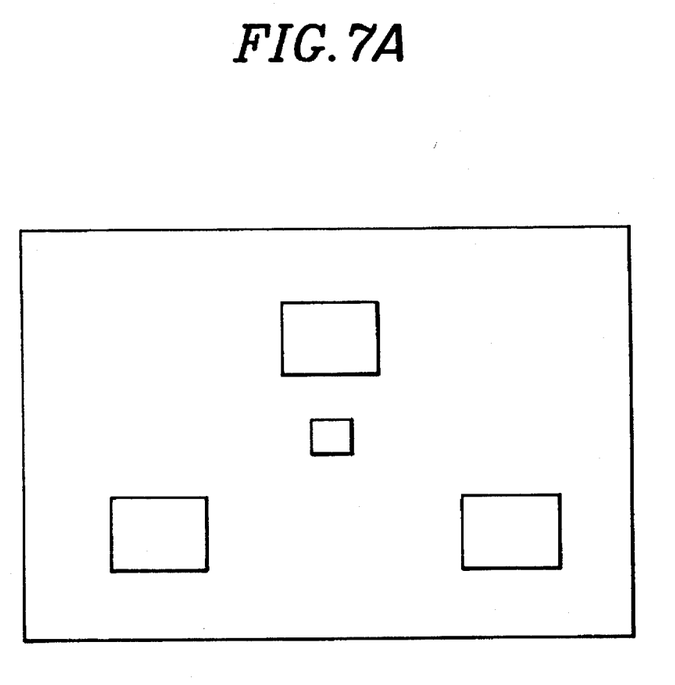
FIG. 7A is a plan view illustrating a dummy open region formed in a proper position of a halftone phase shift mask having three open regions formed therein in accordance with this invention.
Figure 7B:
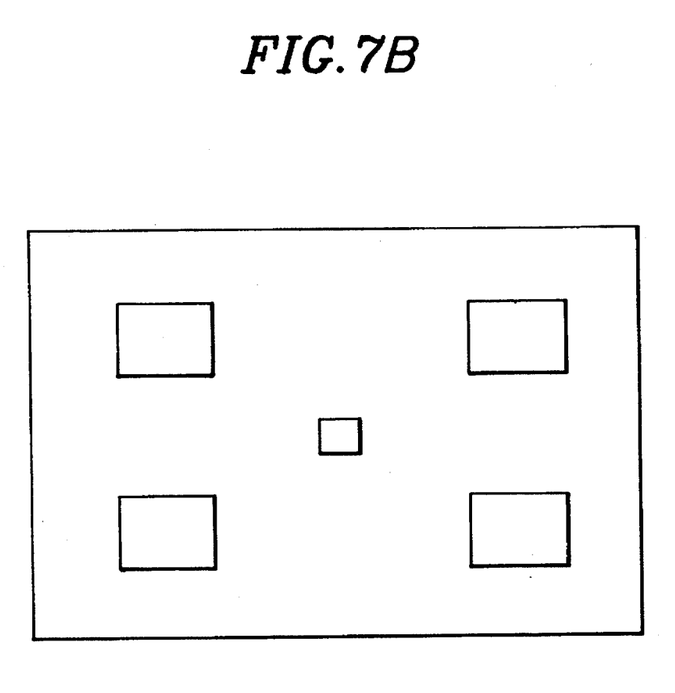
FIG. 7B is a plan view illustrating a dummy open region formed in a proper position of a halftone phase shift mask having four open regions formed therein in accordance with this invention.

FIG. 7A is a plan view of a halftone phase shift mask illustrating a dummy open region formed in a proper position of halftone pattern material layer 2 having three open regions formed therein in accordance with this invention. FIG. 7B is a plan view of a halftone phase shift mask illustrating a dummy open region formed in a proper position of halftone pattern material layer 2 having four open regions formed therein in accordance with this invention.

As has been explained, according to one embodiment of this invention, a halftone pattern material layer is formed on a transparent substrate and positions for more than two open regions of a desired pattern are defined on the halftone pattern material layer. Intensity profiles on the masking material layer of light passed through the open regions of the halftone pattern material layer are obtained through simulations. Positions of the portions of the masking material layer on which new side lobes having a high intensity of light would form due to overlap of side lobes of different profiles with each other are searched.

Thereafter, the positions of the portions of the halftone pattern material layer that corresponds to the positions of the portions of the masking material layer on which the new side lobes would form is determined as the positions on which dummy open regions should be formed. Finally, the halftone pattern of material layer is subjected to a photo process and an etching process (i.e., a patterning process) to form the pattern of open regions and the dummy open regions at the determined positions.

At this time, since the light passed through the dummy open regions would have a phase opposite to the new side lobes formed by the halftone pattern material layer, the intensity of light of the new side lobes would be offset by the intensity of light passed through the dummy open regions.

Sizes of dummy open regions 6 should be determined so that light is passed of less intensity than the intensity of the new side lobes formed by overlap of the side lobes. By doing this, it is possible to prevent formation of new side lobes having a high intensity of light formed by overlap of the side lobes while affecting less the original sizes of the patterns to be formed on wafer 4.

The first embodiment of this invention is devised to provide dummy open regions for offsetting anomalous side lobes having a high intensity of light formed by overlap between the side lobes of light passed through each of the open regions of the halftone phase shift mask. The second embodiment of this invention is a refinement of the first embodiment. The second embodiment is to be explained hereinafter, referring to FIGS. 8A to 8C.

Figure 8A:
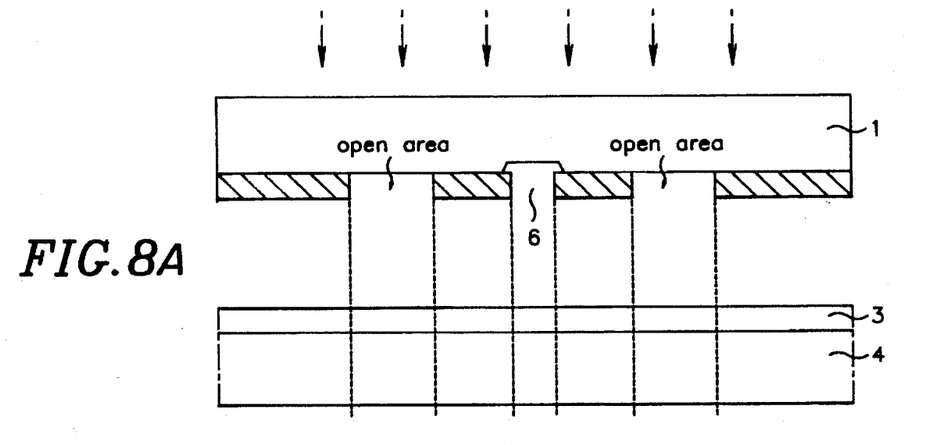
FIGS. 8A to 8C explain the structure and principles of a halftone phase shift mask in accordance with another embodiment of this invention.

First, as illustrated in FIG. 8A, halftone pattern material layer 2 defined with a designated number of open regions of a desired pattern is formed on quartz or glass substrate 1. Positions of the portions of the halftone pattern material layer corresponding to positions of the portions of the masking material layer on which the side lobes of light passed through halftone pattern material layer 2 having the open regions formed therein would overlap to form new side lobes having a high intensity are found through simulations. At this time, since the new side lobes would form due to the light passed through halftone pattern material layer 2, as has been explained in the foregoing first embodiment of this invention, the new side lobes have a phase of 180° opposite to the light passed through the open regions that has a phase of 0°.

Halftone pattern material layer 2 is subjected to a photo process and an etching process to form simultaneously the pattern of open regions at the defined positions of halftone pattern material layer 2 as well as dummy open regions 6 that would pass light having a phase of 0°. Dummy open regions 6 can offset the new side lobes having a phase of 180° on positions of the portions of halftone material layer 2 corresponding to the positions of the portions of the masking material layer on which the new side lobes would otherwise form. The process is identical with the first embodiment, up to now.

Herein, to make the design of this invention simple so as to be applicable even to a large scale integration of elements, it is necessary to reduce the width of the dummy open regions as much as possible.

Therefore, the second embodiment provides a recess in each of the portions of the substrate having dummy open regions 6 formed thereon by removing a portion of the substrate to a certain depth. At this time, the diameter of the recess is formed a little greater than the dummy opened region as illustrated. This is for eliminating not only the center portion of the new side lobe, but also the side portion of the new side lobe, more accurately.

When a certain depth of the portion of substrate 1 is removed making the thickness thinner, more light would pass through this portion. Therefore, it becomes possible to reduce the width of the dummy opened region as much as possible, and to make the pattern design simple. That is, by forming the recess through removing a certain depth of a portion of substrate 1 having the dummy open region formed thereon, this serves as compensation for forming a smaller dummy open region than otherwise would have been determined, in that the effect of passing the same intensity of light can be obtained.

Figure 8B:
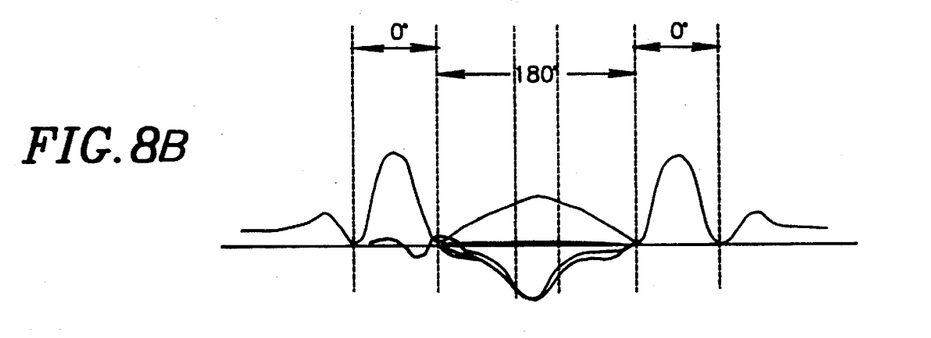
Figure 8C:
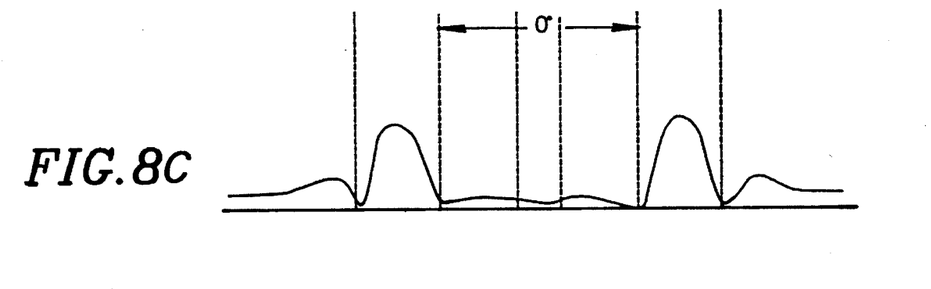

FIGS. 8B and 8C illustrate that the new high intensity side lobe at a phase of 180° formed by the side lobes of light passed through the open regions of the halftone phase shift mask is offset by light at a phase of 0° passed through the dummy open region.

As has been explained, this invention has the following advantages.

First, by forming dummy open regions, formation of unwanted anomalous patterns formed due to overlap of side lobes of light passed through the halftone phase shift mask can be prevented.

Second, by forming a recess through removing a portion of the substrate having the dummy open region formed thereon to a certain depth, the size of the dummy opened region can be reduced and the pattern design can be made simple. Moreover even the side portion of the new side lobe can be reduced more accurately.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for forming a halftone phase shift mask comprising:

forming a halftone pattern material layer on a substrate;

defining positions on the halftone pattern material layer for forming two or more open regions of a desired pattern and for forming one or more dummy open regions, wherein each of the dummy open regions may offset a respective new side lobe formed by overlap of side lobes of light passing through the open regions; and patterning the halftone pattern material layer to form the open regions and the dummy open regions at the defined positions.

2. The method of claim 1, further comprising the step of forming a recess in the substrate at positions corresponding to the dummy open regions.

3. The method of claim 2, wherein each of the recesses are formed wider than the respective dummy open region.

4. The method of claim 1, wherein the halftone pattern material layer comprises chrome oxide.

5. A halftone phase shift mask comprising: a halftone pattern material layer formed on a substrate having two or more open regions; and one or more dummy open regions formed in the halftone pattern material layer for offsetting a side lobe of light passing through the two or more open regions.

6. The halftone phase shift mask of claim 5, wherein the substrate comprises a transparent material.

7. The halftone phase shift mask of claim 5, wherein the substrate has a recess formed at positions corresponding to the dummy open regions.

8. The halftone phase shift mask of claim 7, wherein the recess formed in the substrate is larger than the respective dummy open region.

9. The halftone phase shift mask of claim 5, wherein the halftone pattern material layer comprises chrome oxide.

* * * * *